(12) United States Patent
Imamura

(10) Patent No.: US 9,013,249 B2
(45) Date of Patent: Apr. 21, 2015

(54) ELECTRONIC COMPONENT

(71) Applicant: Murata Manufacturing Co., Ltd., Nagaokakyo-shi, Kyoto-fu (JP)

(72) Inventor: Mitsutoshi Imamura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/272,543

(22) Filed: May 8, 2014

(65) Prior Publication Data

US 2014/0240061 A1     Aug. 28, 2014

Related U.S. Application Data

(63) Continuation of application No. PCT/JP2012/081807, filed on Dec. 7, 2012.

(30) Foreign Application Priority Data

Dec. 28, 2011    (JP) .................... 2011-288969

(51) Int. Cl.
*H03H 7/09*     (2006.01)
*H03H 7/01*     (2006.01)
*H03H 7/12*     (2006.01)
(Continued)

(52) U.S. Cl.
CPC ............. *H03H 7/0115* (2013.01); *H03H 7/12* (2013.01); *H03H 7/09* (2013.01); *H03H 2001/0085* (2013.01); *H03H 7/1708* (2013.01);
(Continued)

(58) Field of Classification Search
CPC ................. H03H 2001/0085; H03H 7/0115; H03H 7/12; H03H 7/09

USPC ........................................................ 333/185
See application file for complete search history.

(56) References Cited

U.S. PATENT DOCUMENTS 8,547,189 B2 * 10/2013 Sasaki et al. ................. 333/185
2007/0241839 A1   10/2007 Taniguchi
(Continued)

FOREIGN PATENT DOCUMENTS

JP    2003-087074 A    3/2003
JP    2003-133882 A    5/2003
(Continued)

OTHER PUBLICATIONS

Official Communication issued in International Patent Application No. PCT/JP2012/081807, mailed on Mar. 12, 2013.

*Primary Examiner* — Benny Lee
*Assistant Examiner* — Rakesh Patel
(74) *Attorney, Agent, or Firm* — Keating & Bennett, LLP

(57) ABSTRACT

An electronic component includes a multilayer body including a plurality of insulating layers stacked on top of one another. An LC parallel resonator is provided in the multilayer body, includes a coil and a capacitor, and has a ring shape when viewed in plan in the x-axis direction. The capacitor includes a capacitor conductor layer connected to one end of the coil and a resonant ground conductor layer that is connected to the other end of the coil and that is provided on the positive z-axis direction side of the capacitor conductor layer. The resonant ground conductor layer faces the capacitor conductor layer with one of the plurality of insulating layers therebetween. An outer electrode is provided on the negative z-axis direction side of the LC parallel resonator and faces the capacitor conductor layer with one of the plurality of insulating layers therebetween.

13 Claims, 8 Drawing Sheets

(51) Int. Cl.
*H01P 1/203* (2006.01)
*H03H 1/00* (2006.01)

(52) U.S. Cl.
CPC ......... *H03H7/1791* (2013.01); *H01P 1/20345* (2013.01); *H03H 7/1775* (2013.01)

(56) References Cited

U.S. PATENT DOCUMENTS

2010/0259344 A1 10/2010 Nosaka
2012/0319801 A1 12/2012 Taniguchi

FOREIGN PATENT DOCUMENTS

| | | |
|---|---|---|
| JP | 2003-258587 A | 9/2003 |
| JP | 2004-153414 A | 5/2004 |
| WO | 2007/119356 A1 | 10/2007 |
| WO | 2009/090917 A1 | 7/2009 |
| WO | 2011/114851 A1 | 9/2011 |

* cited by examiner

ELECTRONIC COMPONENT

BACKGROUND OF THE INVENTION

1. Field of the Invention

The present invention relates to an electronic component and, more specifically, to an electronic component including an LC parallel resonator.

2. Description of the Related Art

Examples of known electronic components include a multilayer band pass filter disclosed in, for example, International Publication No. 2007/119356. The multilayer band pass filter includes a multilayer body and a plurality of LC parallel resonators. The multilayer body is formed by laminating a plurality of dielectric layers on top of one another. Each of the LC parallel resonators includes capacitor electrodes and an inductor electrode. The inductor electrode is formed in the shape of a loop. The loop surfaces of the LC parallel resonators are superposed with one another. In such multilayer band pass filters described above, since the loop surfaces are superposed with one another, the degree of coupling between the inductor electrodes of the LC parallel resonators neighboring each other can be increased, whereby a wider band is realized.

On the other hand, in the multilayer band pass filter disclosed in International Publication No. 2007/119356, self-resonance of the capacitor electrodes is generated. Hence, the impedance of the multilayer band pass filter is decreased at a frequency at which the self-resonance is generated, whereby spurious signals (undesired waves in a high frequency band) are generated.

SUMMARY OF THE INVENTION

Preferred embodiments of the present invention provide an electronic component that significantly reduces or prevents generation of spurious signals.

An electronic component according to a preferred embodiment of the present invention includes a multilayer body including a plurality of insulating layers stacked on top of one another and that includes a mounting surface on a lower side in a laminating direction; a first LC parallel resonator that is provided in the multilayer body and includes a first coil and a first capacitor and that is shaped like a ring when viewed in plan in a direction perpendicular to the laminating direction; and a first ground conductor layer. The first capacitor includes a first capacitor conductor layer connected to one end of the first coil; and a second ground conductor layer that is connected to another end of the first coil and provided on an upper side of the first capacitor conductor layer in the laminating direction and that faces the first capacitor conductor layer with one of the plurality of insulating layers therebetween. The first ground conductor layer is provided on a lower side of the first LC parallel resonator in the laminating direction and faces the first capacitor conductor layer with one of the plurality of insulating layers therebetween.

According to various preferred embodiments of the present invention, generation of spurious signals is significantly reduces or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, electronic components according to preferred embodiments of the present invention will be described.

Figure 1:
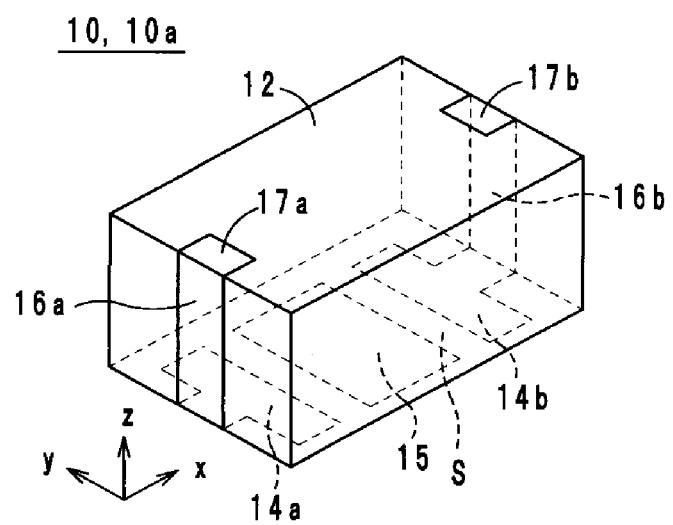
FIG. 1 is an external perspective view of an electronic component according to a preferred embodiment of the present invention.
Figure 2:
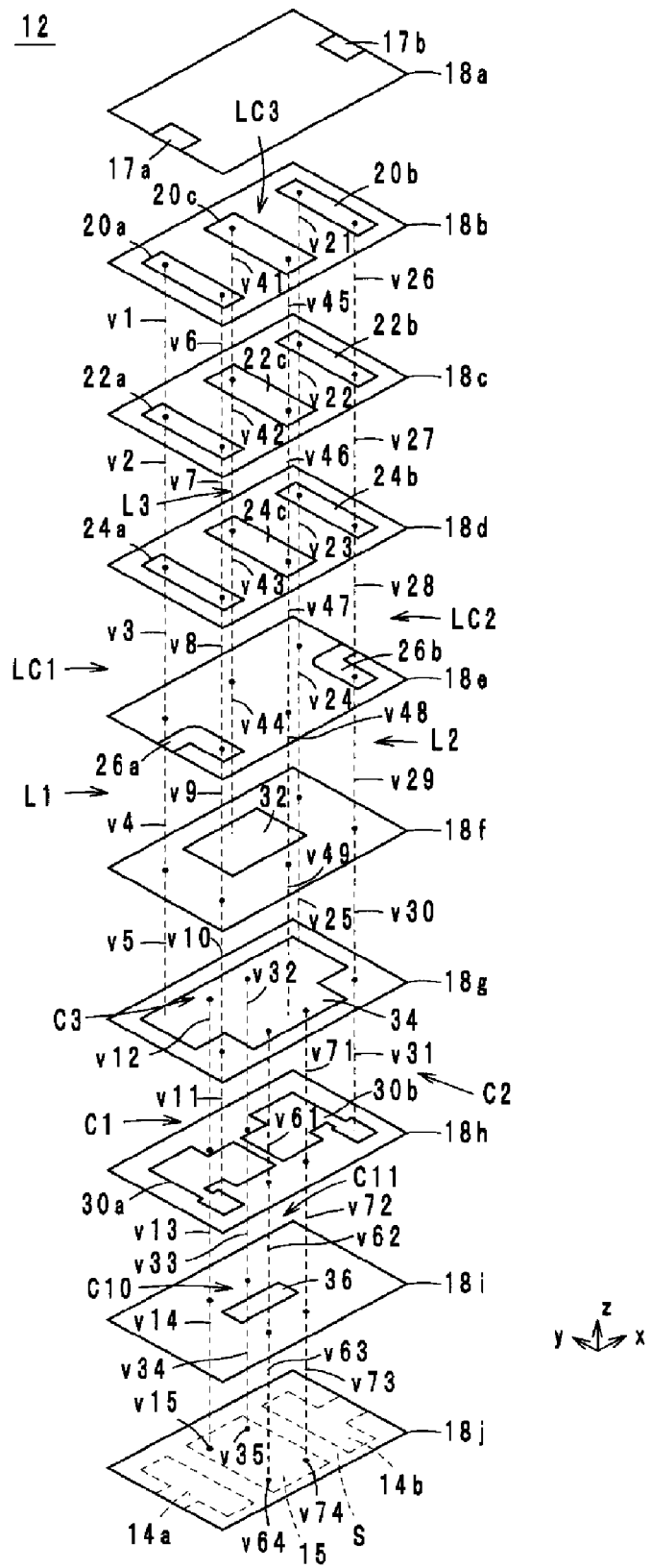
FIG. 2 is an exploded perspective view of a multilayer body of the electronic component.
Figure 3:
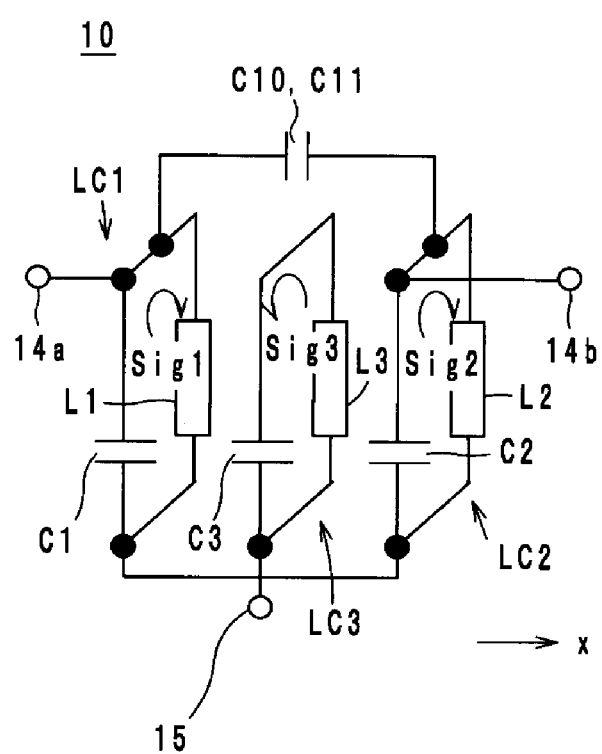
FIG. 3 is an equivalent circuit diagram of the electronic component.

Hereinafter, the configuration of an electronic component according to a preferred embodiment of the present invention will be described with reference to the drawings. FIG. 1 is an external perspective view of an electronic component 10 according to a preferred embodiment of the present invention. FIG. 2 is an exploded perspective view of a multilayer body 12 of the electronic component 10 according to a preferred embodiment of the present invention. FIG. 3 is an equivalent circuit diagram of the electronic component 10. In FIG. 1 and FIG. 2, the z-axis direction corresponds to a laminating direction. The x-axis direction corresponds to a direction in which the long sides of the electronic component 10 extend and the y-axis direction corresponds to a direction in which the short sides of the electronic component 10 extend. The x-axis, y-axis, and z-axis are orthogonal to one another.

Referring to FIG. 1 and FIG. 2, the electronic component 10 includes the multilayer body 12, outer electrodes 14 (14a and 14b) and 15, connection electrodes 16 (16a and 16b), folded-back electrodes 17 (17a and 17b), LC parallel resonators LC1 to LC3, and a coupling conductor layer 36.

Referring to FIG. 2, the multilayer body 12 preferably is formed by laminating insulating layers 18 (18a to 18j) made of a ceramic dielectric material on top of one another and preferably has a rectangular or substantially rectangular parallelepiped shape. The multilayer body 12 includes a mounting surface S on the negative z-axis direction side. The mounting surface S is a surface that faces a circuit substrate when the electronic component 10 is mounted on the circuit substrate.

Referring to FIG. 2, the insulating layers 18 preferably are shaped like rectangles and are formed of, for example, a ceramic dielectric material. The insulating layers 18a to 18j are laminated on top of one another in this order from the positive z-axis direction side to the negative z-axis direction side. Hereinafter, surfaces of the insulating layers 18 facing in the positive z-axis direction are called front surfaces, and surfaces of the insulating layers 18 facing in the negative z-axis direction are called back surfaces.

Referring to FIG. 1, the outer electrode 14a is provided on the mounting surface S and is used as an input electrode. In more detail, the outer electrode 14a is provided on the back surface of the insulating layer 18j and preferably is T-shaped or substantially T-shaped. The outer electrode 14a extends to the center of a short side of the insulating layer 18j on the negative x-axis direction side.

Referring to FIG. 1, the outer electrode 14b is provided on the mounting surface S and is used as an output electrode. In more detail, the outer electrode 14b is provided, on the positive x-axis direction side of the outer electrode 14a, on the back surface of the insulating layer 18j and preferably is T-shaped or substantially T-shaped. The outer electrode 14b extends to the center of a short side of the insulating layer 18j on the positive x-axis direction side.

An outer electrode 15 (corresponding to a first ground conductor layer and a third ground conductor layer) is provided on the mounting surface S and is used as a ground electrode. In more detail, the outer electrode 15 is provided on the back surface of the insulating layer 18j and preferably has a rectangular or substantially rectangular shape extending in the y-axis direction. The outer electrode 15 is sandwiched between the outer electrodes 14a and 14b located on the two sides of the outer electrode 15 in the x-axis direction.

The LC parallel resonator LC1 (first LC parallel resonator) is provided in the multilayer body 12 and includes a coil L1 (first coil) and a capacitor C1 (first capacitor). In more detail, the LC parallel resonator LC1 includes via hole conductors v1 to v11, coil conductor layers 20a, 22a, and 24a, a capacitor conductor layer 30a (first capacitor conductor layer), a resonant ground conductor layer 34 (corresponding to a second ground conductor layer and a fourth ground conductor layer), and preferably is shaped like a rectangular or substantially rectangular ring when viewed in plan in the x-axis direction.

The coil L1 includes the via hole conductors v1 to v11 and the coil conductor layers 20a, 22a, and 24a. The via hole conductors v1 to v5 respectively extend through the insulating layers 18b to 18f in the z-axis direction and are connected to one another, thus defining a single via hole conductor.

The via hole conductors v6 to v11 respectively extend through the insulating layers 18b to 18g in the z-axis direction and are connected to one another, thus defining a single via hole conductor. The via hole conductors v6 to v11 are provided on the negative y-axis direction side of the via hole conductors v1 to v5.

The coil conductor layer 20a is a line-shaped conductor layer which is provided on the front surface of the insulating layer 18b and extends in the y-axis direction. An end portion of the coil conductor layer 20a on the positive y-axis direction side is connected to an end portion of the via hole conductor v1 on the positive z-axis direction side. An end portion of the coil conductor layer 20a on the negative y-axis direction side is connected to an end portion of the via hole conductor v6 on the positive z-axis direction side.

The coil conductor layer 22a is a line-shaped conductor layer which is provided on the front surface of the insulating layer 18c and extends in the y-axis direction. The coil conductor layer 22a and the coil conductor layer 20a are superposed with each other in such a manner that their peripheries are aligned when viewed in plan in the z-axis direction. An end portion of the coil conductor layer 22a on the positive y-axis direction side is connected to an end portion of the via hole conductor v2 on the positive z-axis direction side and an end portion of the via hole conductor v1 on the negative z-axis direction side. An end portion of the coil conductor layer 22a on the negative y-axis direction side is connected to an end portion of the via hole conductor v7 on the positive z-axis direction side and an end portion of the via hole conductor v6 on the negative z-axis direction side.

The coil conductor layer 24a is a line-shaped conductor layer which is provided on the front surface of the insulating layer 18d and extends in the y-axis direction. The coil conductor layer 24a is superposed with the coil conductor layers 20a and 22a in such a manner that their peripheries are aligned when viewed in plan in the z-axis direction. An end portion of the coil conductor layer 24a on the positive y-axis direction side is connected to an end portion of the via hole conductor v3 on the positive z-axis direction side and an end portion of the via hole conductor v2 on the negative z-axis direction side. An end portion of the coil conductor layer 24a on the negative y-axis direction side is connected to an end portion of the via hole conductor v8 on the positive z-axis direction side and an end portion of the via hole conductor v7 on the negative z-axis direction side. In this manner, the coil conductor layers 20a, 22a, and 24a are connected in parallel with one another.

As described above, the coil L1 preferably is U-shaped or substantially U-shaped with an end portion of the via hole conductor v11 on the negative z-axis direction side as one end and an end portion of the via hole conductor v5 on the negative z-axis direction side as the other end.

The capacitor C1 includes the capacitor conductor layer 30a and the resonant ground conductor layer 34.

The resonant ground conductor layer 34 is a conductor layer which is provided on the front surface of the insulating layer 18g and substantially covers the whole front surface of the insulating layer 18g. The resonant ground conductor layer 34 is connected to an end portion of the via hole conductor v5 on the negative z-axis direction side. Hence, the resonant ground conductor layer 34 is connected to the other end of the coil L1.

The capacitor conductor layer 30a is a conductor layer which is provided on the front surface of the insulating layer 18h and preferably has a shape in which two rectangles are connected to each other. In other words, the capacitor conductor layer 30a is provided at a position in the LC parallel resonator LC1 furthest toward the negative side in the z-axis direction. As a result, the resonant ground conductor layer 34 is provided on the positive z-axis direction side of the capacitor conductor layer 30a. The capacitor conductor layer 30a and the resonant ground conductor layer 34 face each other with the insulating layer 18g therebetween. Hence, a capacitance is generated between the capacitor conductor layer 30a and the resonant ground conductor layer 34. The capacitor conductor layer 30a is connected to an end portion of the via hole conductor v11 on the negative z-axis direction side. Hence, the capacitor conductor layer 30a is connected to one end of the coil L1.

As described above, the capacitor C1 has a capacitance equal to the capacitance generated between the capacitor conductor layer 30a and the resonant ground conductor layer 34.

A lead-out conductor layer 26a is provided on the front surface of the insulating layer 18e and preferably is L-shaped or substantially L-shaped. The lead-out conductor layer 26a extends in the positive x-axis direction from the center of a short side of the insulating layer 18e on the negative x-axis direction side, and is bent toward the negative y-axis direction side. The lead-out conductor layer 26a is connected to an end portion of the via hole conductor v9 on the positive z-axis direction side and an end portion of the via hole conductor v8 on the negative z-axis direction side.

The connection electrode 16a is provided on an end surface of the multilayer body 12 on the negative x-axis direction side and extends in the z-axis direction, as illustrated in FIG. 1. An end portion of the connection electrode 16a on the negative z-axis direction side is connected to the outer electrode 14a. The lead-out conductor layer 26a is connected to the outer electrode 14a. As a result, the outer electrode 14a is electrically connected to the LC parallel resonator LC1.

The folded-back electrode 17a is provided on the front surface of the insulating layer 18a and extends in the positive x-axis direction from the center of a short side of the insulating layer 18a on the negative x-axis direction side. The folded-back electrode 17a is connected to the connection electrode 16a.

The LC parallel resonator LC2 (second LC parallel resonator) is provided in the multilayer body 12, and includes a coil L2 (second coil) and a capacitor C2 (second capacitor). The LC parallel resonator LC2 has a structure that is symmetric with the LC parallel resonator LC1 about a plane which is parallel with the y-z plane and which is located in the middle of the end surfaces of the two ends of the multilayer body 12 in the x-axis direction. In more detail, the LC parallel resonator LC2 includes via hole conductors v21 to v31, coil conductor layers 20b, 22b, and 24b, a capacitor conductor layer 30b (second capacitor conductor layer), and a resonant ground layer 34 (fourth ground conductor layer), and preferably is shaped like a rectangular ring when viewed in plan in the x-axis. Further, the LC parallel resonator LC2 is superposed with the LC parallel resonator LC1 when viewed in plan in the x-axis direction.

The coil L2 includes the via hole conductors v21 to v31 and the coil conductor layers 20b, 22b, and 24b. The via hole conductors v21 to v25 respectively extend through the insulating layers 18b to 18f in the z-axis direction and are connected to one another, thus defining a single via hole conductor.

The via hole conductors v26 to v31 respectively extend through the insulating layers 18b to 18g in the z-axis direction and are connected to one another, thus defining a single via hole conductor. The via hole conductors v26 to v31 are provided on the negative y-axis direction side of the via hole conductors v21 to v25.

The coil conductor layer 20b is a line-shaped conductor layer which is provided on the positive x-axis side of the coil conductor layer 20a on the front surface of the insulating layer 18b and extends in the y-axis direction. An end portion of the coil conductor layer 20b on the positive y-axis direction side is connected to an end portion of the via hole conductor v21 on the positive z-axis direction side. An end portion of the coil conductor layer 20b on the negative y-axis direction side is connected to an end portion of the via hole conductor v26 on the positive z-axis direction side.

The coil conductor layer 22b is a line-shaped conductor layer which is provided on the positive x-axis direction side of the coil conductor layer 22a on the front surface of the insulating layer 18c and extends in the y-axis direction. The coil conductor layer 22b and the coil conductor layer 20b are superposed with each other in such a manner that their peripheries are aligned when viewed in plan in the z-axis direction. An end portion of the coil conductor layer 22b on the positive y-axis direction side is connected to an end portion of the via hole conductor v22 on the positive z-axis direction side and an end portion of the via hole conductor v21 on the negative z-axis direction side. An end portion of the coil conductor layer 22b on the negative y-axis direction side is connected to an end portion of the via hole conductor v27 on the positive z-axis direction side and an end portion of the via hole conductor v26 on the negative z-axis direction side.

The coil conductor layer 24b is a line-shaped conductor layer which is provided on the positive x-axis direction side of the coil conductor layer 24a on the front surface of the insulating layer 18d and extends in the y-axis direction. The coil conductor layer 24b is superposed with the coil conductor layers 20b and 22b in such a manner that their peripheries are aligned when viewed in plan in the z-axis direction. An end portion of the coil conductor layer 24b on the positive y-axis direction side is connected to an end portion of the via hole conductor v23 on the positive z-axis direction side and an end portion of the via hole conductor v22 on the negative z-axis direction side. An end portion of the coil conductor layer 24b on the negative y-axis direction side is connected to an end portion of the via hole conductor v28 on the positive z-axis direction side and an end portion of the via hole conductor v27 on the negative z-axis direction side.

As described above, the coil L2 preferably is U-shaped or substantially U-shaped with an end portion of the via hole conductor v31 on the negative z-axis direction side as one end and an end portion of the via hole conductor v25 on the negative z-axis direction side as the other end.

The capacitor C2 includes the capacitor conductor layer 30b and the resonant ground conductor layer 34.

The resonant ground conductor layer 34 is a conductor layer which is provided on the front surface of the insulating layer 18g and substantially covers the whole front surface of the insulating layer 18g. The resonant ground conductor layer 34 is connected to an end portion of the via hole conductor v25 on the negative z-axis direction side. Hence, the resonant ground conductor layer 34 is connected to the other end of the coil L2. In this manner, the ground conductor layer of the capacitor C1 and the ground conductor layer of the capacitor C2 are preferably defined by the single resonant ground layer 34.

The capacitor conductor layer 30b is a conductor layer which is provided on the positive x-axis direction side of the capacitor conductor layer 30a on the front surface of the insulating layer 18h and preferably has a shape in which two rectangles are connected to each other. In other words, the capacitor conductor layer 30b is provided at a position in the LC parallel resonator LC2 farthest toward the negative side in the z-axis direction. As a result, the resonant ground conductor layer 34 is provided on the positive z-axis direction side of the capacitor conductor layer 30b. The capacitor conductor layer 30b and the resonant ground conductor layer 34 face each other with the insulating layer 18g therebetween. Hence, a capacitance is generated between the capacitor conductor layer 30b and the resonant ground conductor layer 34. The capacitor conductor layer 30b is connected to an end portion of the via hole conductor v31 on the negative z-axis direction side. Hence the capacitor conductor layer 30b is connected to one end of the coil L2.

As described above, the capacitor C2 corresponds to the capacitance generated between the capacitor conductor layer 30b and the resonant ground conductor layer 34.

A lead-out conductor layer 26b is provided on the front surface of the insulating layer 18e and preferably is L-shaped or substantially L-shaped. The lead-out conductor layer 26b extends in the negative x-axis direction from the center of a short side of the insulating layer 18e on the positive x-axis direction side, and is bent toward the negative y-axis direction side. The lead-out conductor layer 26b is connected to an end portion of the via hole conductor v29 on the positive z-axis direction side and an end portion of the via hole conductor v28 on the negative z-axis direction side.

The connection electrode 16b is provided on an end surface of the multilayer body 12 on the positive x-axis direction side and extends in the z-axis direction, as illustrated in FIG. 1. An end portion of the connection electrode 16b on the negative z-axis direction side is connected to the outer electrode 14b. The lead-out conductor layer 26b is connected to the outer electrode 14*b*. As a result, the outer electrode 14*b* is electrically connected to the LC parallel resonator LC2.

The folded-back electrode 17*b* is provided on the front surface of the insulating layer 18*a* and extends in the negative x-axis direction from the center of a short side of the insulating layer 18*a* on the positive x-axis direction side. The folded-back electrode 17*b* is connected to the connection electrode 16*b*.

The LC parallel resonator LC3 is provided in the multilayer body 12 and includes a coil L3 and a capacitor C3. In more detail, the LC parallel resonator LC3 includes via hole conductors v41 to v49, coil conductor layers 20*c*, 22*c*, and 24*c*, a capacitor conductor layer 32, and a resonant ground conductor layer 34 and preferably is shaped like a rectangular ring when viewed in plan in the x-axis direction. The LC parallel resonator LC3 is sandwiched between the LC parallel resonators LC1 and LC2 located on the two sides of the LC parallel resonator LC3 in the x-axis direction and is superposed with the LC parallel resonators LC1 and LC2 when viewed in plan in the x-axis direction.

The coil L3 includes the via hole conductors v41 to v49 and the coil conductor layers 20*c*, 22*c*, and 24*c*. The via hole conductors v41 to v44 respectively extend through the insulating layers 18*b* to 18*e* in the z-axis direction and are connected to one another, thus defining a single via hole conductor.

The via hole conductors v45 to v49 respectively extend through the insulating layers 18*b* to 18*f* in the z-axis direction and are connected to one another, thus defining a single via hole conductor. The via hole conductors v45 to v49 are provided on the negative y-axis direction side of the via hole conductors v41 to v44.

The coil conductor layer 20*c* is a line-shaped conductor layer which is provided between the coil conductor layers 20*a* and 20*b* on the front surface of the insulating layer 18*b* and extends in the y-axis direction. An end portion of the coil conductor layer 20*c* on the positive y-axis direction side is connected to an end portion of the via hole conductor v41 on the positive z-axis direction side. An end portion of the coil conductor layer 20*c* on the negative y-axis direction side is connected to an end portion of the via hole conductor v45 on the positive z-axis direction side.

The coil conductor layer 22*c* is a line-shaped conductor layer which is provided between the coil conductor layers 22*a* and 22*b* on the front surface of the insulating layer 18*c* and extends in the y-axis direction. The coil conductor layer 22*c* and the coil conductor layer 20*c* are superposed with each other in such a manner that their peripheries are aligned when viewed in plan in the z-axis direction. An end portion of the coil conductor layer 22*c* on the positive y-axis direction side is connected to an end portion of the via hole conductor v42 on the positive z-axis direction side and an end portion of the via hole conductor v41 on the negative z-axis direction side. An end portion of the coil conductor layer 22*c* on the negative y-axis direction side is connected to an end portion of the via hole conductor v46 on the positive z-axis direction side and an end portion of the via hole conductor v45 on the negative z-axis direction side.

The coil conductor layer 24*c* is a line-shaped conductor layer which is provided between the coil conductor layers 24*a* and 24*b* on the front surface of the insulating layer 18*d* and extends in the y-axis direction. The coil conductor layer 24*c* is superposed with the coil conductor layers 20*c* and 22*c* in such a manner that their peripheries are aligned when viewed in plan in the z-axis direction. An end portion of the coil conductor layer 24*c* on the positive y-axis direction side is connected to an end portion of the via hole conductor v43 on the positive z-axis direction side and an end portion of the via hole conductor v42 on the negative z-axis direction side. An end portion of the coil conductor layer 24*c* on the negative y-axis direction side is connected to an end portion of the via hole conductor v47 on the positive z-axis direction side and an end portion of the via hole conductor v46 on the negative z-axis direction side.

In this manner, the coil L3 preferably is U-shaped or substantially U-shaped with an end portion of the via hole conductor v44 on the negative z-axis direction side as one end and an end portion of the via hole conductor v49 on the negative z-axis direction side as the other end. The coil L3 is electromagnetically coupled to the coils L1 and L2.

The capacitor C3 includes the capacitor conductor layer and the resonant ground conductor layer 34. The capacitor conductor layer 32 is a conductor layer which is provided on the front surface of the insulating layer 18*f* and has a rectangular shape. The capacitor conductor layer 32 is connected to an end portion of the via hole conductor v44 on the negative z-axis direction side. Hence, the capacitor conductor layer 32 is connected to the one end of the coil L3.

The resonant ground conductor layer 34 is provided on the front surface of the insulating layer 18*g*, and hence, is provided on the negative z-axis direction side of the capacitor conductor layer 32. In other words, the resonant ground conductor layer 34 is provided at a position in the LC parallel resonator LC3 farthest toward the negative side in the z-axis direction. The resonant ground conductor layer 34 substantially covers the whole surface of the insulating layer 18*g*. As a result, the capacitor conductor layer 32 faces the resonant ground conductor layer 34 with the insulating layer 18*f* therebetween. Hence, a capacitance is generated between the capacitor conductor layer 32 and the resonant ground conductor layer 34. Further, the resonant ground conductor layer 34 is connected to an end portion of the via hole conductor v49 on the negative z-axis direction side. Hence, the resonant ground conductor layer 34 is connected to the other end of the coil L3. In this manner, the ground conductor layer of the capacitor C1, the ground conductor layer of the capacitor C2, and the ground conductor layer of the capacitor C3 are defined by the single resonant ground conductor layer 34.

The coupling conductor layer 36 is a rectangular or substantially rectangular conductor layer which is provided on the front surface of the insulating layer 18*i* and extends in the x-axis direction. Hence, the coupling conductor layer 36 is provided between the outer electrode 15 and the capacitor conductor layers 30*a* and 30*b* in the z-axis direction. The coupling conductor layer 36 faces the capacitor conductor layers 30*a* and 30*b* with the insulating layer 18*h* therebetween. As a result, capacitors C10 and C11 are respectively provided between the coupling conductor layer 36 and the capacitor conductor layer 30*a* and between the coupling conductor layer 36 and the capacitor conductor layer 30*b*. As a result, the LC parallel resonator LC1 and the LC parallel resonator LC2 are capacitively coupled to each other with the coupling conductor layer 36 therebetween.

The outer electrode 15 is provided on the back surface of the insulating layer 18*j*, and hence, provided on the negative z-axis direction side of the LC parallel resonators LC1 and LC2. The outer electrode 15 faces the capacitor conductor layers 30*a* and 30*b* with the insulating layers 18*h* to 18*j* therebetween and also faces the coupling conductor layer 36 with the insulating layers 18*i* and 18*j* therebetween. The outer electrode 15 is a ground conductor layer to which ground potential of a mother board is directly applied. The ground conductor layer facing the capacitor conductor layer 30*a* and the ground conductor layer facing the capacitor conductor layer 30b are defined by the single outer electrode 15.

Via hole conductors v12 to v15 extend through the insulating layers 18g to 18j in the z-axis direction and are connected to one another, thus defining a single via hole conductor. An end portion of the via hole conductor v12 on the positive z-axis direction side is connected to the resonant ground conductor layer 34. An end portion of the via hole conductor v15 on the negative z-axis direction side is connected to the outer electrode 15.

Via hole conductors v32 to v35 extend through the insulating layers 18g to 18j in the z-axis direction and are connected to one another, thus defining a single via hole conductor. An end portion of the via hole conductor v32 on the positive z-axis direction side is connected to the resonant ground conductor layer 34. An end portion of the via hole conductor v35 on the negative z-axis direction side is connected to the outer electrode 15.

Via hole conductors v61 to v64 extend through the insulating layers 18g to 18j in the z-axis direction and are connected to one another, thus defining a single via hole conductor. An end portion of the via hole conductor v61 on the positive z-axis direction side is connected to the resonant ground conductor layer 34. An end portion of the via hole conductor v64 on the negative z-axis direction side is connected to the outer electrode 15.

Via hole conductors v71 to v74 extend through the insulating layers 18g to 18j in the z-axis direction and are connected to one another, thus defining a single via hole conductor. An end portion of the via hole conductor v71 on the positive z-axis direction side is connected to the resonant ground conductor layer 34. An end portion of the via hole conductor v74 on the negative z-axis direction side is connected to the outer electrode 15.

As described above, the LC parallel resonators LC1 to LC3 are superposed with one another when viewed in plan in the x-axis. The LC parallel resonator LC3 is sandwiched between the LC parallel resonators LC1 and LC2. As a result, as illustrated in FIG. 3, the coil L1 of the LC parallel resonator LC1 and the coil L3 of the LC parallel resonator LC3 are electromagnetically coupled to each other. The coil L3 of the LC parallel resonator LC3 and the coil L2 of the LC parallel resonator LC2 are electromagnetically coupled to each other. Further, as a result of the coupling conductor layer 36, which faces the capacitor conductor layers 30a and 30b, being provided, the LC parallel resonator LC1 and the LC parallel resonator LC2 are capacitively coupled to each other, as illustrated in FIG. 3. The LC parallel resonators LC1 to LC3 configured as described above define a band pass filter.

Next, an example of the operation of the electronic component 10 will be described with reference to FIG. 1 to FIG. 3. For example, when a high-frequency signal Sig1 having a positive voltage is input at the outer electrode 14a, the high-frequency signal Sig1 flows clockwise in the LC parallel resonator LC1 when viewed in plan from the positive x-axis direction side, as illustrated in FIG. 3.

The coil L1 of the LC parallel resonator LC1 and the coil L3 of the LC parallel resonator LC3 are electromagnetically coupled to each other. Hence, when the high-frequency signal Sig1 flows in the LC parallel resonator LC1 clockwise when viewed from the positive x-axis direction side, a high-frequency signal Sig3 flows counterclockwise in the LC parallel resonator LC3 through electromagnetic induction when viewed in plan from the positive x-axis direction side.

The LC parallel resonator LC3 and the LC parallel resonator LC2 are electromagnetically coupled to each other. Hence, when the high-frequency signal Sig3 flows in the LC parallel resonator LC3 counterclockwise when viewed from the positive x-axis direction side, a high-frequency signal Sig2 flows clockwise in the LC parallel resonator LC2 through electromagnetic induction when viewed in plan from the positive x-axis direction side. As a result, the high-frequency signal Sig2 is output from the outer electrode 14b.

Here, the LC parallel resonators LC1 to LC3 have natural resonant frequencies respectively determined by the coils L1 to L3 and the capacitors C1 to C3. The impedances of the LC parallel resonators LC1 to LC3 become high at these resonant frequencies. As a result, the high-frequency signal Sig2 in a predetermined frequency band determined by these resonant frequencies is output from the outer electrode 14b.

Further, when the high-frequency signal Sig1 is input at the outer electrode 14a and the high-frequency signal Sig2 is output from the outer electrode 14b, spurious signals may be generated in a frequency band used by the electronic component 10 (hereinafter, called a predetermined frequency band) due to the self resonance of the capacitor conductor layers 30a and 30b. Hence, the capacitor conductor layers 30a and 30b are configured to face the outer electrode 15 in the electronic component 10. With this configuration, high-frequency signals generated by the self resonance flow to the outer electrode 15 through the capacitor conductor layers 30a and 30b. As a result, output, from the outer electrode 14b, of high-frequency signals generated in the predetermined frequency band due to the self resonance of the capacitor conductor layers 30a and 30b is suppressed, such that generation of spurious signals is significantly reduced or prevented.

A method of manufacturing the electronic component 10 will now be described with reference to FIG. 1 and FIG. 2.

First, ceramic green sheets which are to become the insulating layers 18 are prepared. Then, the via hole conductors v1 to v15, v21 to v35, v41 to v49, v61 to v64, and v71 to v74 are provided in the ceramic green sheets corresponding to the insulating layers 18b to 18j. Specifically, the via holes preferably are formed by irradiating the ceramic green sheets corresponding to the insulating layers 18b to 18j with a laser beam. Then, these via holes are filled with a conductive paste composed of, for example, Ag, Pd, Cu, Au, or an alloy thereof, using a printing method or the like.

Then, by applying a conductive paste mainly composed of, for example, Ag, Pd, Cu, Au, or an alloy thereof, on the front surfaces of the ceramic green sheets corresponding to the insulating layers 18a to 18i using a screen printing method or a photolithography method, thus defining the folded-back electrodes 17a and 17b, the coil conductor layers 20a to 20c, 22a to 22c, and 24a to 24c, the lead-out conductor layers 26a and 26b, the capacitor conductor layers 30a, 30b, and 32, the resonant ground conductor layer 34, and the coupling conductor layer 36. Note that the via holes may be filled with a conductive paste when forming the coil conductor layers 20a to 20c, 22a to 22c, and 24a to 24c, the lead-out conductor layers 26a and 26b, the capacitor conductor layers 30a, 30b, and 32, the resonant ground conductor layer 34, and the coupling conductor layer 36.

Then, by applying a conductive paste mainly composed of, for example, Ag, Pd, Cu, Au, or an alloy thereof, on the back surface of the ceramic green sheet corresponding to the insulating layer 18j using a screen printing method or a photolithography method, thus defining the outer electrodes 14a, 14b, and 15. Note that the via holes may be filled with a conductive paste when forming the outer electrodes 14a, 14b, and 15.

Then the ceramic green sheets are laminated on top of one another. Specifically, a ceramic green sheet corresponding to the insulating layer 18j is arranged. Then a ceramic green sheet corresponding to the insulating layer 18i is arranged on the ceramic green sheet corresponding to the insulating layer 18j. Then, the ceramic green sheet corresponding to the insulating layer 18i is press-bonded to the ceramic green sheet corresponding to the insulating layer 18j. Then ceramic green sheets corresponding to the insulating layers 18h, 18g, 18f, 18e, 18d, 18c, 18b, and 18a are similarly laminated on top of one another and press-bonded in this order. Through the above steps, a mother multilayer body constituted by a plurality of multilayer bodies 12 is formed. This mother multilayer body is subjected to final press-bonding using an isostatic press or the like.

Then, the mother multilayer body is cut into the multilayer bodies 12 having predetermined dimensions using a cutting blade. Each of the multilayer bodies 12 to be sintered is subjected to debinding processing and sintering processing.

Through the steps described above, a sintered multilayer body 12 is obtained. The multilayer body 12 is subjected to barrel finishing for chamfering the edges.

Then, a conductive paste is applied, thus defining the connection electrodes 16a and 16b.

Finally, the surfaces of the outer electrodes 14a, 14b, and 15, the connection electrodes 16a and 16b, and the folded-back electrodes 17a and 17b are plated with Ni and Sn in this order. Through the steps described above, the electronic component 10 illustrated in FIG. 1 is completed.

With the electronic component 10 configured as described above, generation of spurious signals in a predetermined frequency band is significantly reduced or prevented. In more detail, in the electronic component 10, the outer electrode 15, which is a ground conductor layer, is provided at a position, on the negative z-axis direction side of the LC parallel resonators LC1 and LC2, farthest toward the negative side in the z-axis direction, and faces the capacitor conductor layers 30a and 30b with the insulating layers 18h to 18j therebetween. As a result, even when high-frequency signals are generated due to generation of self resonance in the capacitor conductor layers 30a and 30b, the high-frequency signals flow to the outer electrode 15. Hence, output, from the outer electrode 14b, of the high-frequency signals generated due to the self resonance of the capacitor conductor layers 30a and 30b is suppressed, such that generation of spurious signals in the predetermined frequency band is significantly reduced or prevented.

Further, in the electronic component 10, generation of spurious signals in the predetermined frequency band is effectively reduced or prevented due to the reasons described below. In more detail, in the electronic component 10, generation of spurious signals is significantly reduced or prevented as a result of the capacitor conductor layers 30a and 30b being configured to face a ground conductor layer. Here, the ground conductor layer facing the capacitor conductor layers 30a and 30b is the outer electrode 15. Hence, a case where inductor components are provided between the ground conductor layer and the outer electrode 15 can be avoided, unlike the case where the ground conductor layer is provided separately from the outer electrode 15 and a via hole conductor is provided between the ground conductor layer and the outer electrode 15. As a result, high-frequency signals generated due to self resonance is output from the outer electrode 15 to the outside of the electronic component 10 without being reflected to the inside of the electronic component 10 due to an inductor component between the ground conductor layer and the outer electrode 15. As described above, generation of spurious signals in the predetermined frequency band is effectively reduced or prevented in the electronic component 10.

Further, in the electronic component 10, the LC parallel resonator LC1 and the LC parallel resonator LC2 are electromagnetically coupled to each other. Hence, the frequency of an attenuation pole in the pass characteristics for a high-frequency signal in the electronic component 10 is lowered.

In the electronic component 10, the capacitor conductor layers 30a and 30b of the LC parallel resonators LC1 and LC2 are provided on the negative z-axis direction side of the resonant ground conductor layer 34, and the capacitor conductor layer 32 of the LC parallel resonator LC3 is provided on the positive z-axis direction side of the resonant ground conductor layer 34. Hence, the capacitor conductor layer 32 does not face the coupling conductor layer 36 and the capacitor conductor layers 30a and 30b. As a result, a case where the LC parallel resonators LC1 and LC2 are coupled to the LC parallel resonator LC3 as a result of the capacitor conductor layer 32 facing the coupling conductor layer and the capacitor conductor layers 30a and 30b is avoided. Hence, the frequency of the attenuation pole is further lowered in the pass characteristics for a high-frequency signal in the electronic component 10.

Figure 4:
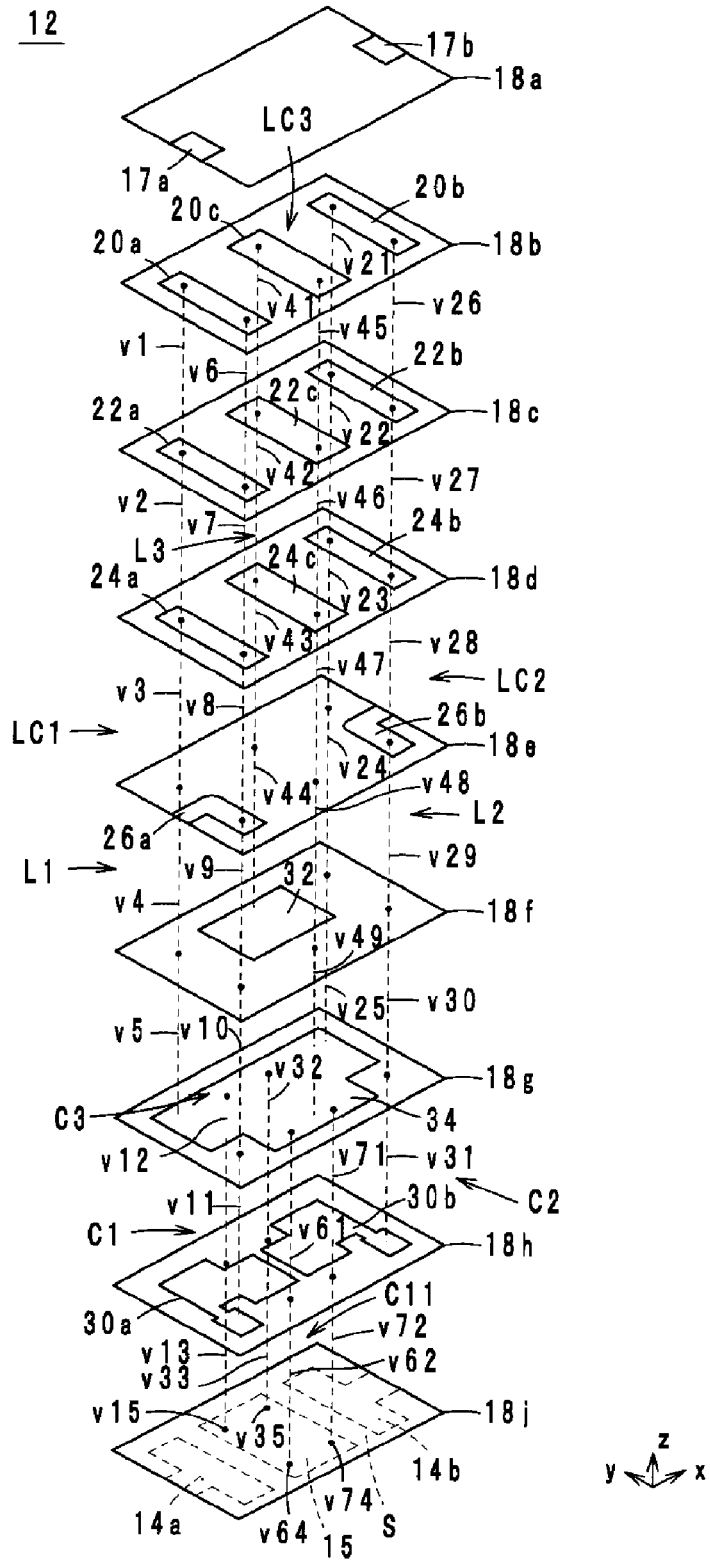
FIG. 4 is an exploded perspective view of a multilayer body of an electronic component according to a first modification of a preferred embodiment of the present invention.

Hereinafter, an electronic component according to a first modification of a preferred embodiment of the present invention will be described with reference to the drawings. FIG. 4 is an exploded perspective view of a multilayer body 12 of an electronic component 10a according to a first modification of a preferred embodiment of the present invention.

Unlike the electronic component 10, the electronic component 10a does not include the insulating layer 18i, the coupling conductor layer 36, and the via hole conductors v14, v34, v63, and v73. Since the coupling conductor layer 36 is not provided, the degree of coupling between the LC parallel resonator LC1 and the LC parallel resonator LC2 is lower in the electronic component 10a than in the electronic component 10.

The electronic component 10a configured as described above also significantly reduces or prevents generation of spurious signals, similarly to the electronic component 10.

Figure 5:
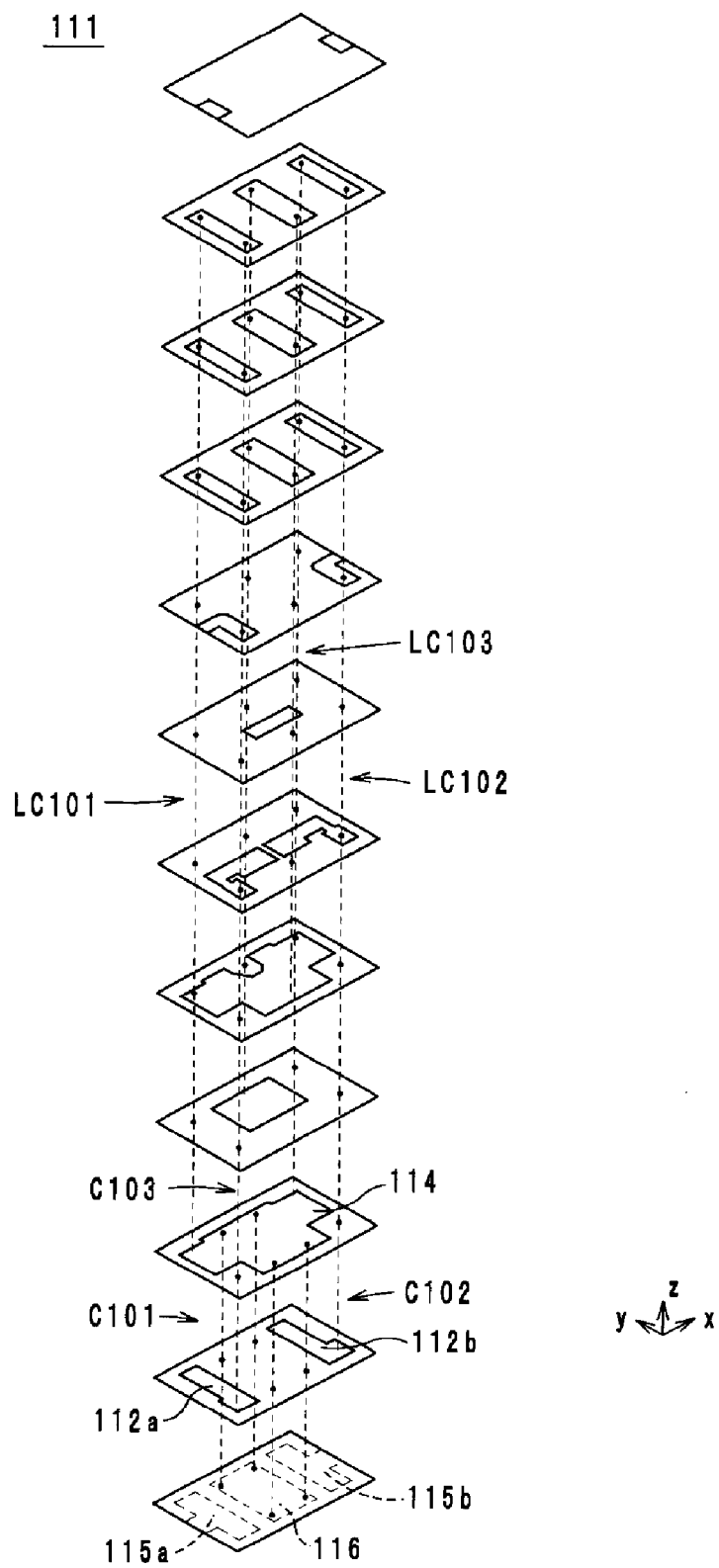
FIG. 5 is an exploded perspective view of a multilayer body of an electronic component according to a comparative example.

The inventor of the present invention performed computer simulation described below to further clarify the effects of the electronic components 10 and 10a. FIG. 5 is an exploded perspective view of a multilayer body 111 of an electronic component according to a comparative example. Only reference symbols related to the description are illustrated in FIG. 5.

First, the electronic component according to the comparative example will be described with reference to FIG. 5. The electronic component according to the comparative example includes LC parallel resonators LC101 to LC103. The LC parallel resonators LC101 to LC103 respectively include capacitors C101 to C103. Here, capacitor conductor layers 112a and 112b of the capacitors C101 and C102 are provided on the negative z-axis direction side of a ground conductor layer 114, and respectively face outer electrodes 115a and 115b. However, the capacitor conductor layers 112a and 112b do not face an outer electrode 116 which is provided on the negative z-axis direction side and to which the ground potential is applied.

Figure 6:
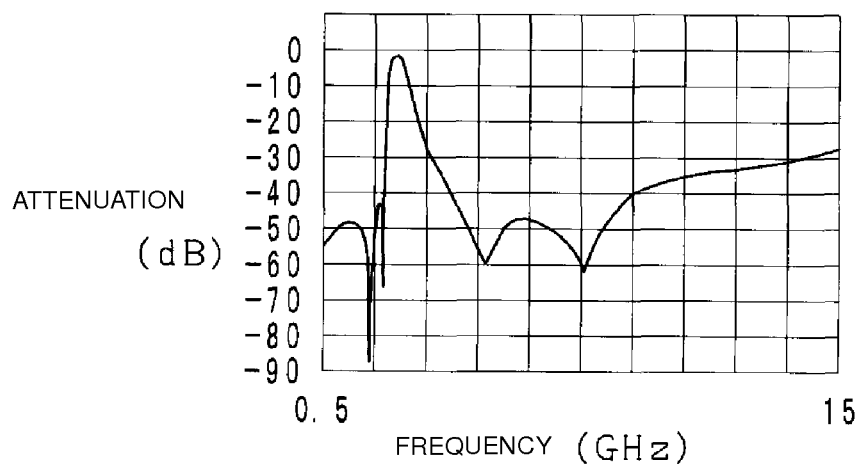
FIG. 6 is a graph illustrating a simulation result regarding a first model.
Figure 7:
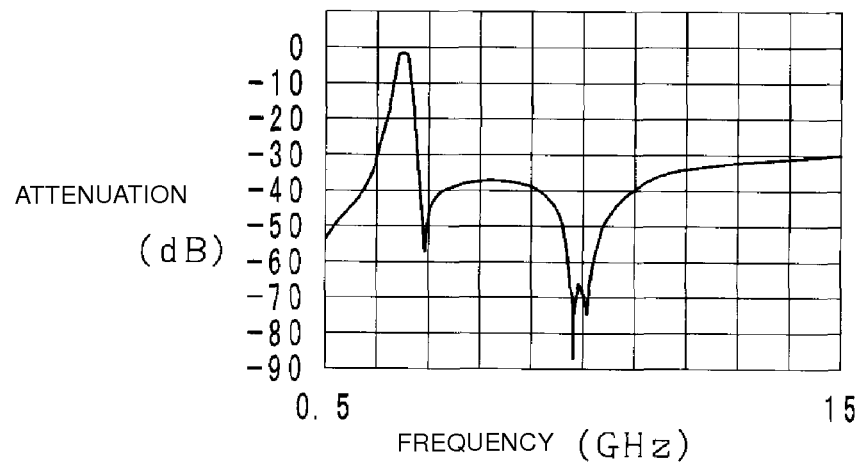
FIG. 7 is a graph illustrating a simulation result regarding a second model.
Figure 8:
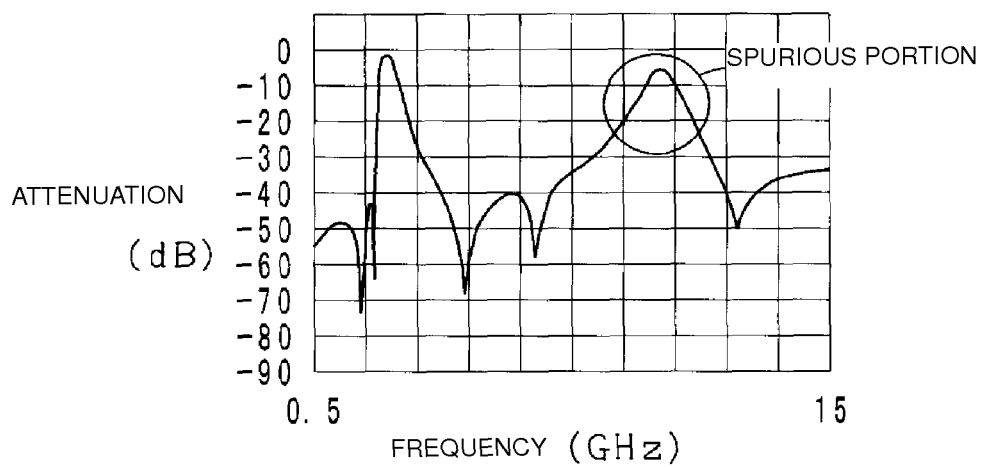
FIG. 8 is a graph illustrating a simulation result regarding a third model.

First, a first model and a second model which respectively have the configurations illustrated in FIG. 2 and FIG. 4 were produced. Further, a third model having the configuration illustrated in FIG. 5 was produced. Then attenuation of an output signal compared with an input signal was obtained for each of the first to third models. FIG. 6 is a graph illustrating the simulation result for the first model. FIG. 7 is a graph illustrating the simulation result for the second model. FIG. 8 is a graph illustrating the simulation result for the third model.

In FIGS. 6 to 8, the vertical axis represents attenuation and the horizontal axis represents frequency.

Referring to FIG. 8, in the third model, it can be seen that a spurious portion is generated in the vicinity of 10 GHz. On the other hand, in the first and second models, a spurious portion is not generated in the vicinity of 10 GHz, as illustrated in FIG. 6 and FIG. 7. As can be seen from the above results, generation of spurious signals is significantly reduced or prevented in the predetermined frequency band in the electronic components 10 and 10a.

Further, the frequency of the attenuation pole is about 5 GHz in the first model, as illustrated in FIG. 6, whereas the frequency of the attenuation pole is about 3.5 GHz in the second model, as illustrated in FIG. 7. Hence, it can be seen that, as a result of the coupling conductor layer 36 being provided, the frequency of the attenuation pole of the electronic component 10 becomes lower than the frequency of the attenuation pole of the electronic component 10a, and the attenuation on the high-frequency side near the pass band becomes steeper.

Figure 9:
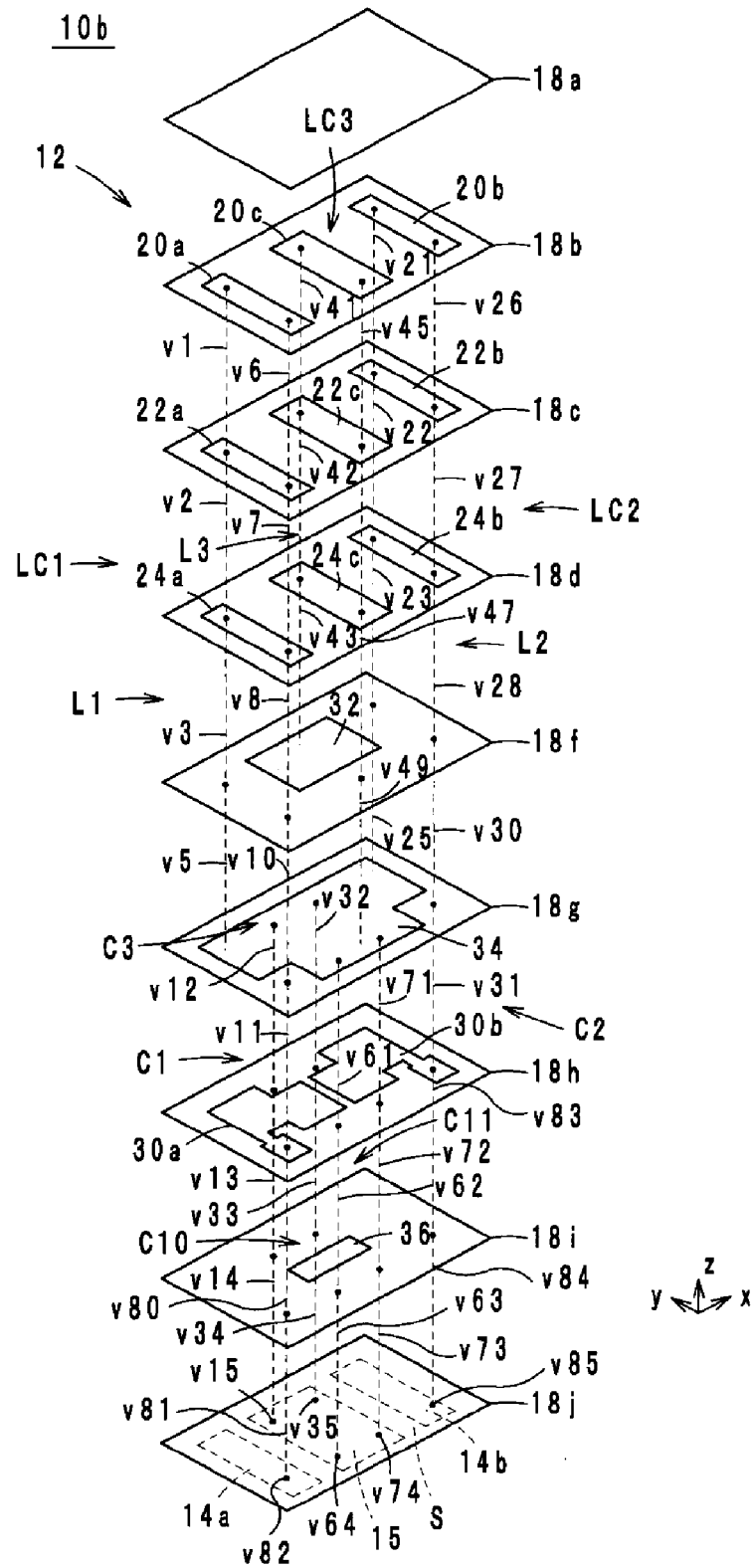
FIG. 9 is an exploded perspective view of an electronic component according to a second modification of a preferred embodiment of the present invention.

Hereinafter, an electronic component according a second modification of a preferred embodiment of the present invention will be described with reference to the drawings. FIG. 9 is an exploded perspective view of an electronic component 10b according to the second modification of a preferred embodiment of the present invention.

Unlike the electronic component 10, the electronic component 10b does not include the connection electrodes 16a and 16b, the folded-back electrodes 17a and 17b, the insulating layer 18e, the lead-out conductor layers 26a and 26b, and the via hole conductors v4, v9, v24, v29, v44, and v48, and includes via hole conductors v80 to v85.

In more detail, in the electronic component 10b, the outer electrodes include only the outer electrodes 14a, 14b, and 15. Hence, the lead-out conductor layers 26a and 26b are not needed. Further, it is not required that the outer electrodes 14a and 14b extend respectively to the short side of the insulating layer 18j on the negative x-axis direction side and the short side of the insulating layer 18j on the positive x-axis direction side.

However, since the outer electrode 14a needs to be connected to the coil L1 and the capacitor C1, the via hole conductors v80 to v82 are provided. The via hole conductors v80 to v82 extend through the insulating layers 18h to 18j in the z-axis direction and are connected to one another, thus defining a single via hole conductor. An end portion of the via hole conductor v80 on the positive z-axis direction side is connected to the capacitor conductor layer 30a. An end portion of the via hole conductor v82 on the negative z-axis direction side is connected to the outer electrode 14a.

Since the outer electrode 14b needs to be connected to the coil L2 and the capacitor C2, the via hole conductors v83 to v85 are provided. The via hole conductors v83 to v85 extend through the insulating layers 18h to 18j in the z-axis direction and are connected to one another, thus defining a single via hole conductor. An end portion of the via hole conductor v83 on the positive z-axis direction side is connected to the capacitor conductor layer 30b. An end portion of the via hole conductor v85 on the negative z-axis direction side is connected to the outer electrode 14b.

The electronic component 10b configured as described above has an equivalent circuit that is the same as that of the electronic component 10. Further, the electronic component 10b also significantly reduces or prevents generation of spurious signals, similarly to the electronic component 10.

Other Preferred Embodiments

The configuration of an electronic component according to the present invention is not limited to those of the electronic components 10, 10a, and 10b according to the preferred embodiments described above, and various modifications are possible within the scope of the present invention.

Note that the capacitor conductor layers 30a and 30b preferably face the outer electrode 15 in the electronic components 10, 10a, and 10b. However, the capacitor conductor layers 30a and 30b may be configured to face a lower-layer ground conductor layer provided within the multilayer body 12. In this case, the lower-layer ground conductor layer (corresponding to the first ground conductor layer and third ground conductor layer) is provided on the positive z-axis direction side of the outer electrode 15, and is connected to the outer electrode 15 through a via hole conductor.

Note that although three LC parallel resonators are preferably provided in the electronic components 10, 10a, and 10b, the number of the LC parallel resonators is not limited to this, and need only be at least one.

As described above, preferred embodiments of the present invention are useful in electronic components and, in particular, provides an advantage in that generation of spurious signals is significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a multilayer body including a plurality of insulating layers laminated on top of one another and a mounting surface on a lower side in a laminating direction;
   a first LC parallel resonator that is provided in the multilayer body and includes a first coil and a first capacitor and the first LC parallel resonator is ring-shaped or substantially ring-shaped when viewed in a plan view in a direction perpendicular to the laminating direction; and
   a first ground conductor layer; wherein
   the first capacitor includes:
      a first capacitor conductor layer connected to one end of the first coil; and
      a second ground conductor layer that is connected to another end of the first coil and is provided on an upper side of the first capacitor conductor layer in the laminating direction and that faces the first capacitor conductor layer with one of the plurality of insulating layers therebetween; and
   the first ground conductor layer is provided on a lower side of the first LC parallel resonator in the laminating direction and faces the first capacitor conductor layer with another one of the plurality of insulating layers therebetween,
   the electronic component further includes:
   a second LC parallel resonator that is provided in the multilayer body and includes a second coil and a second capacitor and the first LC parallel resonator is ring-shaped or substantially ring-shaped when viewed in the plan view in the direction perpendicular to the laminating direction; and
   a third ground conductor layer;
   the second capacitor includes:
      a second capacitor conductor layer connected to one end of the second coil; and
      a fourth ground conductor layer that is connected to another end of the second coil and is provided on an upper side of the second capacitor conductor layer in the laminating direction and that faces the second capacitor conductor layer with the one of the plurality of insulating layers therebetween; wherein the third ground conductor layer is provided on a lower side of the second LC parallel resonator in the laminating direction and faces the second capacitor conductor layer with the another one of the plurality of insulating layers therebetween;

the first LC parallel resonator and the second LC parallel resonator are electromagnetically coupled to each other to define a filter; and the electronic component further includes a coupling conductor layer that faces the first capacitor conductor layer and the second capacitor conductor layer with the another one of the plurality of insulating layers therebetween and that is provided between the first and second capacitor conductor layers and the first and third ground conductor layers.

2. The electronic component according to claim 1, wherein the coupling conductor layer is configured to capacitively couple the first and second LC parallel resonators together.

3. The electronic component according to claim 1, wherein the second LC parallel resonator includes via hole conductors and coil conductor layers; and the third ground conductor layer is a resonant ground conductor layer a resonant ground conductor layer.

4. The electronic component according to claim 1, wherein the second ground conductor layer and the fourth ground conductor layer are defined by a single conductor layer.

5. The electronic component according to claim 1, wherein the first ground conductor layer and the third ground conductor layer are defined by a single conductor layer.

6. The electronic component according to claim 1, wherein the first LC parallel resonator includes via hole conductors and coil conductor layers; and the second ground conductor layer is a resonant ground conductor layer a resonant ground conductor layer.

7. The electronic component according to claim 1, further comprising outer electrodes, connection electrodes, and folded-back electrodes.

8. The electronic component according to claim 1, further comprising:
 a ground electrode provided on the mounting surface; wherein
 the first ground conductor layer is connected to the ground electrode.

9. The electronic component according to claim 1, wherein the first ground conductor layer is a ground electrode provided on the mounting surface.

10. The electronic component according to claim 1, further comprising:
 a third LC parallel resonator that is provided in the multilayer body and includes a third coil and a third capacitor and the third LC parallel resonator is ring-shaped or substantially ring-shaped when viewed in plan in the direction perpendicular to the laminating direction; wherein
 the third capacitor includes:
  a third capacitor conductor layer connected to one end of the third coil; and
  a fifth ground conductor layer that is connected to another end of the third coil and is provided on a lower side of the third capacitor conductor layer in the laminating direction and that faces the third capacitor conductor layer with a third one of the plurality of insulating layers therebetween; wherein
 the third LC parallel resonator is sandwiched between the first LC parallel resonator and the second LC parallel resonator in the direction perpendicular to the laminating direction; and
 the first LC parallel resonator, the second LC parallel resonator, and the third LC parallel resonator are electromagnetically coupled to each other to define the filter.

11. The electronic component according to claim 10, wherein the second ground conductor layer, the fourth ground conductor layer, and the fifth ground conductor layer are defined by a single conductor layer.

12. The electronic component according to claim 10, wherein the third LC parallel resonator includes via hole conductors and coil conductor layers; and the fourth ground conductor layer is a resonant ground conductor layer a resonant ground conductor layer.

13. The electronic component according to claim 10, further comprising outer electrodes, wherein the first, second and third capacitor conductor layers are configured to face at least one of the outer electrodes.

* * * * *